(12) United States Patent
Oka et al.

(10) Patent No.: US 10,586,745 B2
(45) Date of Patent: Mar. 10, 2020

(54) AIRTIGHT PACKAGE AND METHOD FOR MANUFACTURING SAME

(71) Applicant: NIPPON ELECTRIC GLASS CO., LTD., Otsu-shi, Shiga (JP)

(72) Inventors: Takuji Oka, Otsu (JP); Koichi Yabuuchi, Otsu (JP); Toru Shiragami, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 16/090,824

(22) PCT Filed: Feb. 20, 2017

(86) PCT No.: PCT/JP2017/006086
§ 371 (c)(1),
(2) Date: Oct. 3, 2018

(87) PCT Pub. No.: WO2018/003164
PCT Pub. Date: Jan. 4, 2018

(65) Prior Publication Data
US 2019/0096778 A1    Mar. 28, 2019

(30) Foreign Application Priority Data

Jun. 29, 2016  (JP) .................................. 2016-128838

(51) Int. Cl.
*H01L 23/02* (2006.01)
*H01L 23/10* (2006.01)
(Continued)

(52) U.S. Cl.
CPC .......... *H01L 23/10* (2013.01); *H01L 21/4803* (2013.01); *H01L 21/50* (2013.01);
(Continued)

(58) Field of Classification Search
CPC ......... H01L 23/10; H01L 23/02; H01L 23/08; H01L 21/50; H01L 21/4803
See application file for complete search history.

(56) References Cited

U.S. PATENT DOCUMENTS

| 6,414,236 | B1 * | 7/2002 | Kataoka | ............ B32B 17/10678 136/244 |
| 8,492,893 | B1 * | 7/2013 | Sohn | ....................... H01L 24/05 257/737 |

(Continued)

FOREIGN PATENT DOCUMENTS

| JP | 2002-359535 A | 12/2002 |
| JP | 2003-158208 A | 5/2003 |

(Continued)

OTHER PUBLICATIONS

Official Communication issued in International Patent Application No. PCT/JP2017/006086, dated Apr. 18, 2017.

*Primary Examiner* — Phuc T Dang
(74) *Attorney, Agent, or Firm* — Keating and Bennett, LLP

(57) ABSTRACT

Provided are an airtight package that can increase the bonding strength between the sealing material layer and the container and a method for manufacturing the same. An airtight package 1 includes: a container 2 with a frame 3; a glass lid 4 disposed on top of the frame 3 and sealing the container 2; and a sealing material layer 5 disposed between the frame 3 and the glass lid 4 and bonding the glass lid 4 and the container 2 together, wherein in the sealing material layer 5 a bonding surface 5*b* between the sealing material layer 5 and the container 2 is larger than a bonding surface 5*a* between the sealing material layer 5 and the glass lid 4.

9 Claims, 4 Drawing Sheets

(51) Int. Cl.
*H01L 23/08* (2006.01)
*H01L 33/48* (2010.01)
*H01L 21/50* (2006.01)
*H01L 21/48* (2006.01)

(52) U.S. Cl.
CPC .............. *H01L 23/02* (2013.01); *H01L 23/08* (2013.01); *H01L 33/48* (2013.01); *H01L 33/483* (2013.01); *H01L 2924/16195* (2013.01); *H01L 2933/0033* (2013.01)

(56) References Cited

U.S. PATENT DOCUMENTS

| | | | |
|---|---|---|---|
| 2015/0037525 A1 | 2/2015 | Maeda et al. | |
| 2015/0266772 A1* | 9/2015 | Mitsui | C03C 8/24 |
| | | | 428/76 |
| 2015/0380330 A1* | 12/2015 | Mitsui | H01L 23/04 |
| | | | 257/680 |
| 2016/0120051 A1* | 4/2016 | Kamakura | H01B 3/004 |
| | | | 361/807 |

FOREIGN PATENT DOCUMENTS

| | | |
|---|---|---|
| JP | 2013-165367 A | 8/2013 |
| JP | 2013-182977 A | 9/2013 |
| JP | 2013-203047 A | 10/2013 |
| JP | 2014-236202 A | 12/2014 |
| JP | 2016-27610 A | 2/2016 |
| JP | 2016-86049 A | 5/2016 |

* cited by examiner

[FIG. 1]
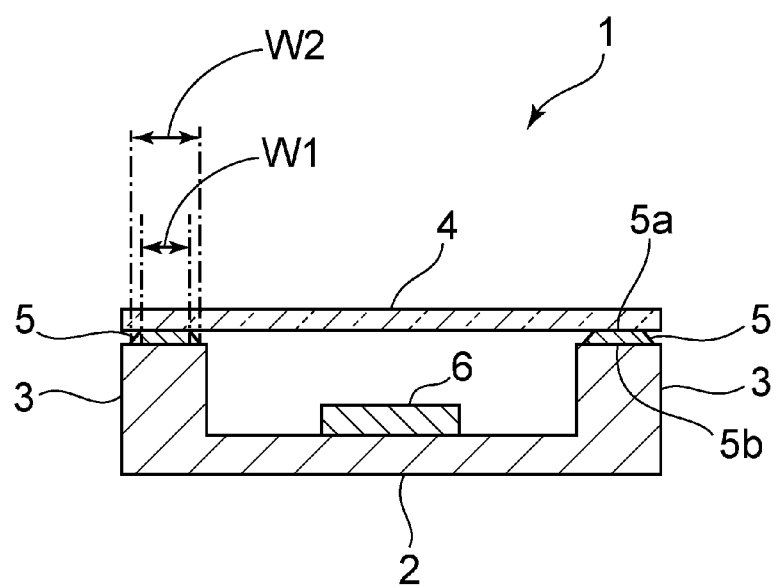

[FIG. 2]
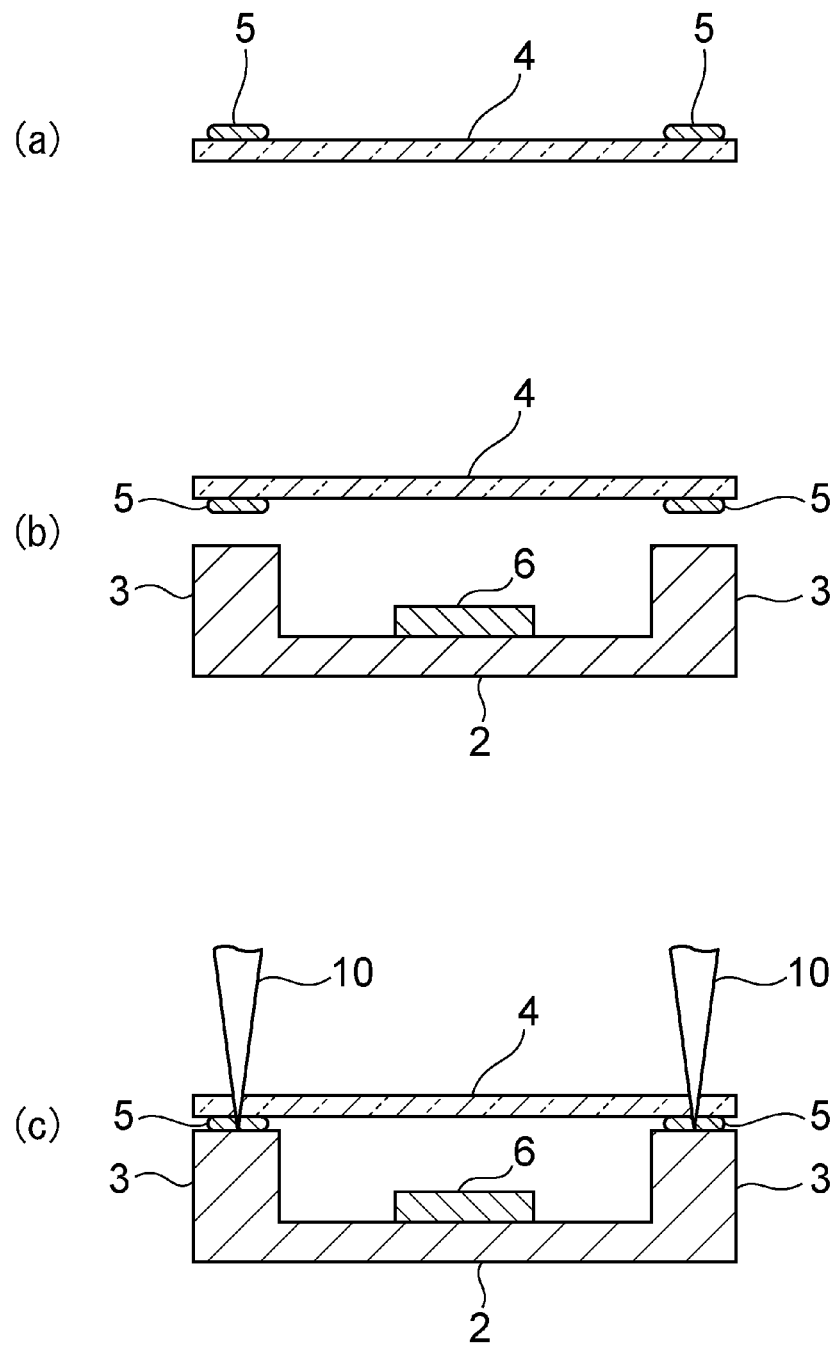

[FIG. 3]
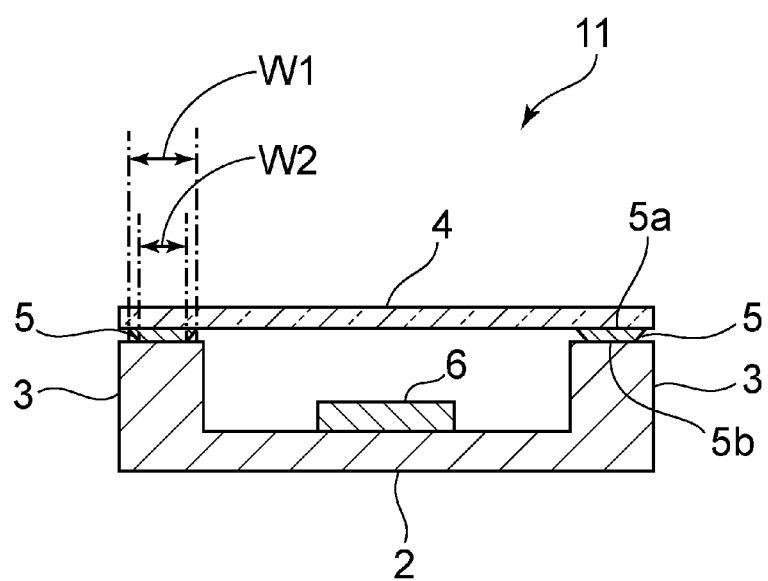

[FIG. 4]
(a) 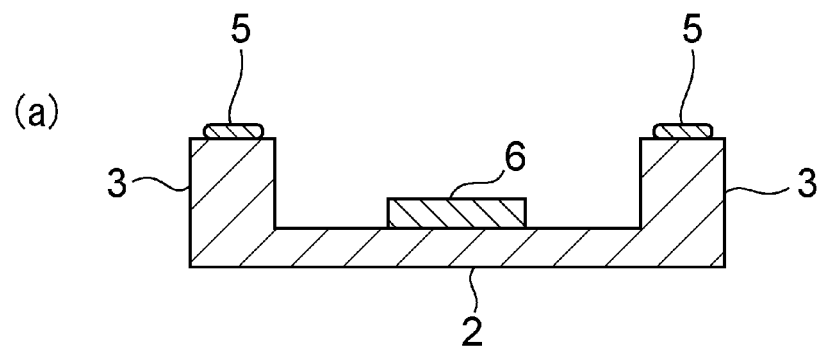
(b) 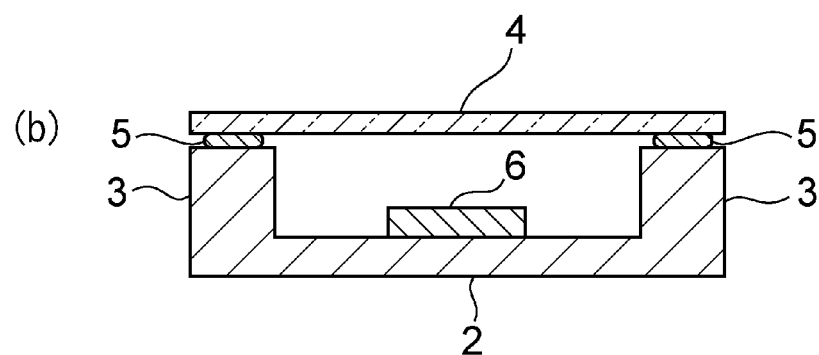
(c) 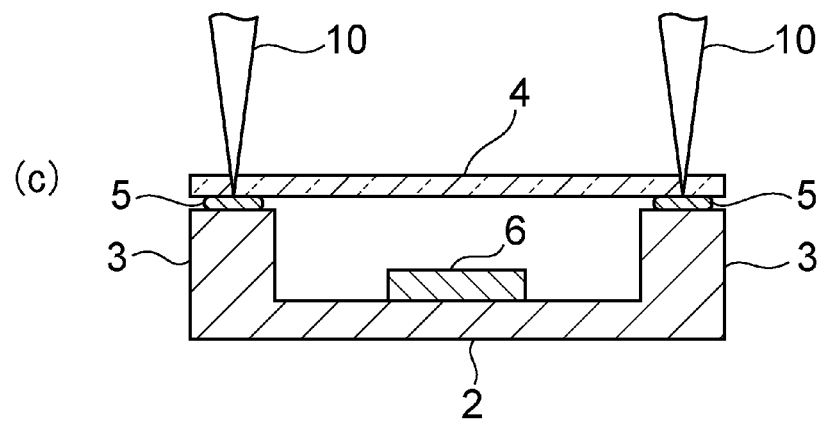

AIRTIGHT PACKAGE AND METHOD FOR MANUFACTURING SAME

TECHNICAL FIELD

The present invention relates to airtight packages for the purpose of mounting a device therein and sealing it and also to methods for manufacturing the same.

BACKGROUND ART

An airtight package is being used for the purpose of mounting a device, such as an LED, therein and sealing it. Such an airtight package is formed so that a container capable of mounting a device therein and a cover member for sealing the interior of the container are bonded together through a sealing material.

Patent Literature 1 below discloses an airtight package formed so that a container made of a glass ceramic and a glass lid are bonded together through a sealing material. In Patent Literature 1, a glass frit made of a low-melting-point glass is used as the sealing material. Furthermore, in Patent Literature 1, the glass-ceramic substrate and the glass lid are bonded together by firing the sealing material to melt it.

However, if in mounting a low thermal resistance device, such as a deep-ultraviolet LED device, the glass frit is fired and melted in such a manner as in Patent Literature 1, characteristics of the device may be thermally degraded by the application of heat during firing.

As a solution to this, a method is conceivable in which a sealing material containing a laser absorbing material is irradiated with laser light to be heated locally, thus melting the glass frit (Patent Literature 2).

CITATION LIST

Patent Literature

[PTL 1]
JP-A-2014-236202
[PTL 2]
JP-A-2016-86049

SUMMARY OF INVENTION

Technical Problem

The inventors have found that, however, the above technique has a problem that since the sealing material layer contains a laser absorbing material, laser light is absorbed in the sealing material layer and fails to sufficiently heat the interface between the container and the sealing material layer, so that the bonding strength between the glass lid and the sealing material layer is high but the bonding strength between the sealing material layer and the container is low.

An object of the present invention is to provide an airtight package that can increase the bonding strength between the sealing material layer and the container and to provide a method for manufacturing the same.

Solution to Problem

An airtight package according to the present invention includes: a container with a frame; a glass lid disposed on top of the frame and sealing the container; and a sealing material layer disposed between the frame and the glass lid and bonding the glass lid and the container together, wherein in the sealing material layer a bonding surface between the sealing material layer and the container is larger than a bonding surface between the sealing material layer and the glass lid.

The sealing material layer preferably has a thickness within a range of 1 to 100 μm.

The sealing material layer preferably contains at least one metal selected from the group consisting of Fe, Mn, and Cu or an oxide of the at least one metal in a content of 5% by mass or less.

The container is preferably made of aluminum nitride.

An electronic device according to the present invention includes the above-described airtight package according to the present invention and a device housed in the airtight package.

A method for manufacturing an airtight package according to the present invention includes the steps of: preparing a container with a frame, a glass lid that seals the container, and a sealing material layer that bonds the glass lid and the container together; disposing the sealing material layer between the frame and the glass lid to lay the glass lid on top of the container; and irradiating the sealing material through the glass lid with laser light brought to focus on or around an interface between the frame and the sealing material layer, thus bonding the glass lid and the container with the sealing material layer.

In the manufacturing method according to the present invention, the sealing material layer preferably has a permeability of 10% or more to wavelength of the laser light.

In the manufacturing method according to the present invention, the sealing material layer is preferably disposed between the frame and the glass lid by laying on top of the container the glass lid having the sealing material layer formed thereon.

In the manufacturing method according to the present invention, the sealing material layer is preferably disposed to lie within a top surface of the frame when the glass lid is laid on top of the container.

ADVANTAGEOUS EFFECTS OF INVENTION

The present invention enables increase in the bonding strength between the sealing material layer and the container.

BRIEF DESCRIPTION OF DRAWINGS

FIG. 1 is a schematic cross-sectional view showing an airtight package according to an embodiment of the present invention.

FIG. 2 is schematic cross-sectional views showing the process of manufacturing the airtight package according to the embodiment shown in FIG. 1.

FIG. 3 is a schematic cross-sectional view showing an airtight package according to a comparative example.

FIG. 4 is schematic cross-sectional views showing the process of manufacturing the airtight package according to the comparative example shown in FIG. 3.

DESCRIPTION OF EMBODIMENTS

Hereinafter, a description will be given of a preferred embodiment. However, the following embodiment is merely illustrative and the present invention is not limited to the following embodiment. Throughout the drawings, members having substantially the same functions may be referred to by the same reference characters.

FIG. 1 is a schematic cross-sectional view showing an airtight package according to an embodiment of the present invention. As shown in FIG. 1, an airtight package 1 according to this embodiment includes: a container 2 with a frame 3; a glass lid 4 disposed on top of the frame 3 and sealing the container 2; and a sealing material layer 5 disposed between the frame 3 and the glass lid 4 and bonding the glass lid 4 and the container 2 together. A device 6 is housed in the container 2.

In this embodiment, the sealing material layer 5 bonds the glass lid 4 and the container 2 together so that its bonding surface 5b adjacent to the container 2 becomes larger than its bonding surface 5a adjacent to the glass lid 4. The sealing material layer 5 generally contains glass and, therefore, has good bondability to the glass lid 4. Hence, the bonding surface 5a adjacent to the glass lid 4 can obtain necessary bonding strength even if it is relatively small. In this embodiment, the bonding strength between the container 2 and the sealing material layer 5 is increased by making the bonding surface 5b adjacent to the container 2 relatively large.

The cross section of the sealing material layer 5 in a direction perpendicular to a direction of extension thereof along the frame 3 has a tapered shape widening from the bonding surface 5a toward the bonding surface 5b as shown in FIG. 1. Specifically, the above cross section of the sealing material layer 5 has a trapezoidal shape. Therefore, the width W2 of the sealing material layer 5 at the bonding surface 5b is larger than the width W1 of the sealing material layer 5 at the bonding surface 5a. The width W2 of the sealing material layer 5 is preferably 1.05 or more times the width W1 of the sealing material layer 5. Thus, the bonding strength between the sealing material layer 5 and the container 2 can be more securely increased. The width W2 of the sealing material layer 5 is more preferably within a range of 1.05 to 1.5 times the width W1 of the sealing material layer 5. If the ratio of the width W2 of the sealing material 5 to the width W1 of the sealing material 5 is too large, the bonding strength between the glass lid 4 and the sealing material layer 5 may be too small.

The sealing material layer 5 preferably has a thickness within a range of 1 to 100 μm. If the thickness of the sealing material layer 5 is too small, sufficient bonding strength may not be able to be obtained. If the thickness of the sealing material layer 5 is too large, the allowable sharing stress of the sealing material layer 5 decreases, so that sufficient bonding strength may not be able to be obtained. The thickness of the sealing material layer 5 is more preferably within a range of 3 to 20 μm.

A glass frit containing a low-melting-point glass powder is preferably used as a sealing material for forming the sealing material layer 5. If the glass frit contains a low-melting-point glass powder, the sealing material can be softened at a lower temperature, so that thermal degradation of the device can be further prevented. Examples of the low-melting-point glass powder that can be used include $Bi_2O_3$-based glass powders, $SnO$-$P_2O_5$-based glass powders, and $V_2O_5$-$TeO_2$-based glass powders.

The sealing material layer 5 to be preferably used is one permeable to laser light for heating the sealing material layer 5 to soften it in a manufacturing process to be described hereinafter. The permeability of the sealing material layer 5 to the wavelength of laser light is preferably 10% or more, more preferably 20% or more, and still more preferably 30% or more. By increasing the permeability to the wavelength of laser light, the interface between the frame 3 and the sealing material layer 5 and its vicinity can be efficiently heated to increase the bonding strength between the sealing material layer 5 and the container 2. The upper limit of the permeability of the sealing material layer 5 to the wavelength of laser light is, but not particularly limited to, about 80%.

From the viewpoint of increasing the permeability to laser light, the sealing material layer 5 is preferably substantially free of laser absorbing material. A generally known laser absorbing material is at least one metal selected from the group consisting of Fe, Mn, and Cu or an oxide of the at least one metal. Therefore, the content of at least one metal selected from the group consisting of Fe, Mn, and Cu or an oxide of the at least one metal in the sealing material layer 5 is preferably 5% by mass or less and more preferably 3% by mass or less.

The sealing material layer 5 may contain a low-expansion refractory filler within a range where a desired permeability to the wavelength of laser light can be achieved. Examples of the low-expansion refractory filler that can be cited include cordierite, willemite, alumina, zirconium phosphate-based compounds, zircon, zirconia, tin oxide, quartz glass, β-quartz solid solution, β-eucryptite, and spodumene.

A glass forming the glass lid 4 preferably has a permeability to laser light and its permeability to the wavelength of laser light is preferably 80% or more. Examples of such a glass include $SiO_2$-$B_2O_3$-RO-based glasses (where R is Mg, Ca, Sr or Ba), $SiO_2$-$B_2O_3$-R'O-based glasses (where R' is Li, Na or Ka), $SiO_2$-$B_2O_3$-RO-$R'_2O$-based glasses, SnO-$P_2O_5$-based glasses, $TeO_2$-based glasses, and $Bi_2O_3$-based glasses and these glasses can be used as the glass lid 4.

The container 2 is made of, for example, a ceramic, a glass-ceramic or a glass. Examples of the ceramic that can be cited include aluminum oxide, aluminum nitride, zirconia, and mullite. Examples of the glass-ceramic that can be cited are LTCCs (low temperature co-fired ceramics). A specific example of the LTCC that can be cited is a sintered body of a mixture of an inorganic powder, such as titanium oxide or niobium oxide, and a glass powder. For example, the same glass as used for the glass lid 4 can be used as the glass powder.

Aluminum nitride is known as a material having poor wettability on glass materials and has a problem that with the use of a sealing material layer containing glass, the bonding strength between the container and the sealing material layer cannot sufficiently be achieved. In the present invention, since the sealing material layer 5 is formed so that the bonding surface 5b adjacent to the container 2 becomes relatively large, the bonding strength between the container 2 and the sealing material 5 can be improved.

For the purpose of improving the wettability on glass materials, it has heretofore been considered that an oxide layer is formed on the surface of the container made of aluminum nitride by heat treatment or other means. However, if an oxide layer is formed on the surface of aluminum nitride in which a device is to be mounted, there arise problems, such as reduction in heat dissipation properties, and the properties of aluminum nitride having good heat radiation are impaired. The present invention enables increase in the bonding strength between the container and the sealing material layer without the need to form an oxide layer on the container surface. However, also in the present invention, an oxide layer may be formed on the surface of the frame 3 made of aluminum nitride, followed by sealing with the sealing material layer 5.

No particular limitation is placed on the type of the device 6 in the present invention. Since the present invention enables the use of materials having good heat dissipation properties, such as aluminum nitride, as described above, even a device having low thermal resistance, i.e., even a device having a low upper service temperature limit, can be used as the device 6. For example, a device having an upper service temperature limit of 350° C. or less can be housed in the airtight package according to the present invention. Examples of such a device that can be cited include MEMSs (micro electro mechanical systems) and deep-ultraviolet LEDs (light emitting diodes).

However, the device 6 is not limited to the above, but light-emitting devices, such as LEDs other than the above LEDs and LDs (laser diodes), light-receiving devices, such as CCDs (charge coupled devices), and other devices can also be used.

FIG. 2 is schematic cross-sectional views showing the process of manufacturing the airtight package according to the embodiment shown in FIG. 1.

As shown in FIG. 2(*a*), a sealing material, such as a glass frit, is applied to the back of a glass lid 4 to form a sealing material layer 5. Next, as shown in FIG. 2(*b*), the glass lid 4 is placed on top of a container 2 so that the sealing material layer 5 is located on the frame 3 of the container 2 housing a device 6.

Next, as shown in FIG. 2(*c*), the sealing material layer 5 is heated and softened by irradiation through the glass lid 4 with laser light 10, thus bonding the glass lid 4 and the container 2 with the sealing material layer 5. In doing so, the irradiation with the laser light 10 is brought to focus on or around the interface between the frame 3 and the sealing material layer 5. Since the sealing material layer 5 has high permeability to the laser light 10, the laser light 10 can reach the interface between the frame 3 and the sealing material layer 5 and its vicinity and focus on or around the interface between the frame 3 and the sealing material layer 5. Thus, heat is applied to the sealing material layer 5 and the frame 3 centering on or around the interface between the frame 3 and the sealing material layer 5, so that the bonding strength between the frame 3 and the sealing material layer 5 can be increased. Furthermore, a portion of the sealing material layer 5 closer to the frame 3 is more likely to be softened and fluidized and, therefore, the cross section of the sealing material layer 5 has a tapered shape widening toward the frame 3 as shown in FIG. 1.

The wavelength of the laser light is preferably within a range of 600 to 1600 nm and, for example, a semiconductor laser can be used as a light source that emits such laser light.

As shown in FIG. 2(*c*), the sealing material layer 5 is disposed to lie within the top surface of the frame 3 when the glass lid 4 is laid on top of the container 2. Thus, it can be prevented that the heated and softened sealing material layer 5 protrudes from the frame 3 to the surroundings.

In this embodiment, the container 2 made of aluminum nitride is used. Since, as described previously, aluminum nitride has poor wettability on glass materials, the sealing material layer 5 is formed by applying the sealing material, not onto the frame 3, but to the glass lid 4.

In the above manner, an airtight package 1 can be manufactured which, as shown in FIG. 1, includes a sealing material layer 5 whose bonding surface 5*b* adjacent to the container 2 is larger than the bonding surface 5*a* adjacent to the glass lid 4.

FIG. 3 is a schematic cross-sectional view showing an airtight package according to a comparative example. In an airtight package 11 according to this comparative example, a glass lid 4 is bonded to a container 2 using a sealing material containing a laser absorbing material, as in Patent Literature 2. Therefore, the cross section of a sealing material layer 5 has an inverse tapered shape, opposite to that in the present invention, widening from the bonding surface 5*b* toward the bonding surface 5*a* as shown in FIG. 3. Therefore, the width W2 of the sealing material layer 5 at the bonding surface 5*b* is smaller than the width W1 of the sealing material layer 5 at the bonding surface 5*a*. Therefore, sufficient bonding strength between the container 2 and the sealing material layer 5 cannot be obtained.

FIG. 4 is schematic cross-sectional views showing the process of manufacturing the airtight package according to the comparative example shown in FIG. 3.

As shown in FIG. 4(*a*), a sealing material containing a laser absorbing material is applied on the frame 3 of a container 2 housing a device 6 to form a sealing material layer 5. Next, as shown in FIG. 4(*b*), a glass lid 4 is placed on top of the container 2 so that the sealing material layer 5 is located on the frame 3 of the container 2 housing the device 6.

Next, as shown in FIG. 4(*c*), the sealing material layer 5 is heated and softened by irradiation through the glass lid 4 with laser light 10, thus bonding the glass lid 4 and the container 2 with the sealing material layer 5. Since the sealing material layer 5 contains a laser absorbing material, the laser light 10 cannot reach the interface between the frame 3 and the sealing material layer 5 and its vicinity. Therefore, the irradiation with the laser light 10 is brought to focus on or around the interface between the glass lid 4 and the sealing material layer 5. Hence, a portion of the sealing material layer 5 closer to the glass lid 4 is more likely to be softened and fluidized. As a result, the cross section of the sealing material layer 5 has an inverse tapered shape widening toward the glass lid 4 as shown in FIG. 3.

Thus, the airtight package 11 according to the comparative example cannot obtain sufficient bonding strength between the container 2 and the sealing material layer 5 and, therefore, has poor reliability. Furthermore, if aluminum nitride is used as a material for the container 2, the bonding strength between the container 2 and the sealing material layer 5 will be further reduced.

According to the present invention, since the sealing material layer 5 is formed so that the bonding surface 5*b* adjacent to the container 2 becomes larger than the bonding surface 5*a* adjacent to the glass lid 4, the bonding strength between the glass lid 4 and the container 2 can be increased, thus providing a high-reliability airtight package.

REFERENCE SIGNS LIST

1 . . . airtight package
2 . . . container
3 . . . frame
4 . . . glass lid
5 . . . sealing material layer
5*a* . . . bonding surface adjacent to glass lid
5*b* . . . bonding surface adjacent to container
6 . . . device
10 . . . laser light
W1 . . . width of sealing material layer at bonding surface adjacent to glass lid
W2 . . . width of sealing material layer at bonding surface adjacent to container

The invention claimed is:
1. An airtight package comprising:
a container with a frame;
a glass lid disposed on top of the frame and sealing the container; and a sealing material layer disposed between the frame and the glass lid and bonding the glass lid and the container together, wherein in the sealing material layer a bonding surface between the sealing material layer and the container is larger than a bonding surface between the sealing material layer and the glass lid, and a cross section of the sealing material layer in a direction perpendicular to a direction of extension of the sealing material layer along the frame has a tapered shape widening from the bonding surface between the sealing material layer and the glass lid toward the bonding surface between the sealing material layer and the container.

2. The airtight package according to claim 1, wherein the sealing material layer has a thickness within a range of 1 to 100 μm.

3. The airtight package according to claim 1, wherein the sealing material layer contains at least one metal selected from the group consisting of Fe, Mn, and Cu or an oxide of the at least one metal in a content of 5% by mass or less.

4. The airtight package according to claim 1, wherein the container is made of aluminum nitride.

5. An electronic device comprising: the airtight package according to claim 1; and a device housed in the airtight package.

6. A method for manufacturing the airtight package according to claim 1, the method comprising the steps of:

preparing the container with the frame, the glass lid that seals the container, and the sealing material layer that bonds the glass lid and the container together;

disposing the sealing material layer between the frame and the glass lid to lay the glass lid on top of the container; and irradiating the sealing material through the glass lid with laser light brought to focus on or around an interface between the frame and the sealing material layer, thus bonding the glass lid and the container with the sealing material layer.

7. The method for manufacturing an airtight package according to claim 6, wherein the sealing material layer has a permeability of 10% or more to wavelength of the laser light.

8. The method for manufacturing an airtight package according to claim 6, wherein the sealing material layer is disposed between the frame and the glass lid by laying on top of the container the glass lid having the sealing material layer formed thereon.

9. The method for manufacturing an airtight package according to claim 6, wherein the sealing material layer is disposed to lie within a top surface of the frame when the glass lid is laid on top of the container.

\* \* \* \* \*